(12) United States Patent
Geusic

(10) Patent No.: US 6,894,309 B2
(45) Date of Patent: May 17, 2005

(54) SPATIAL REGIONS OF A SECOND MATERIAL IN A FIRST MATERIAL

(75) Inventor: Joseph E. Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/628,243

(22) Filed: Jul. 29, 2003

(65) Prior Publication Data

US 2004/0038527 A1 Feb. 26, 2004

Related U.S. Application Data

(62) Division of application No. 10/118,350, filed on Apr. 9, 2002.

(51) Int. Cl.[7] .............................................. H01L 31/036
(52) U.S. Cl. ............................... 257/64; 74/103; 74/73; 74/136; 74/749
(58) Field of Search ........................... 257/64, 74, 103, 257/73, 136, 749

(56) References Cited

U.S. PATENT DOCUMENTS

| 5,440,421 | A | * | 8/1995 | Fan et al. ................... 359/245 |
| 5,689,275 | A | * | 11/1997 | Moore et al. ................ 343/786 |
| 5,990,850 | A | | 11/1999 | Brown et al. |
| 6,261,469 | B1 | * | 7/2001 | Zakhidov et al. ............. 216/56 |
| 6,358,854 | B1 | | 3/2002 | Fleming et al. |
| 6,433,931 | B1 | | 8/2002 | Fink et al. |
| 6,476,409 | B2 | | 11/2002 | Iwasaki et al. |
| 6,582,512 | B2 | * | 6/2003 | Geusic et al. .................. 117/3 |
| 2002/0045030 | A1 | * | 4/2002 | Ozin et al. ................... 428/173 |

\* cited by examiner

*Primary Examiner*—Matthew Smith
*Assistant Examiner*—Igwe U. Anya
(74) *Attorney, Agent, or Firm*—Dickstein Shapiro Morin & Oshinsky LLP

(57) ABSTRACT

A surface-transformation method of forming regions of a second material in a first solid material to control the properties of the first solid material is disclosed. The regions of the second material are formed in the first solid material by drilling holes to a predefined depth and at a predefined lattice position. The holes in the first solid material are then filled with a second material and then the first and second materials are heated to a temperature close to the melting point of the first solid material to spontaneously form the regions filled with the second material and embedded in the first solid material at the desired location. A liquid-phase immersion method or a deposition method may be employed to fill the holes in the first solid material.

14 Claims, 10 Drawing Sheets

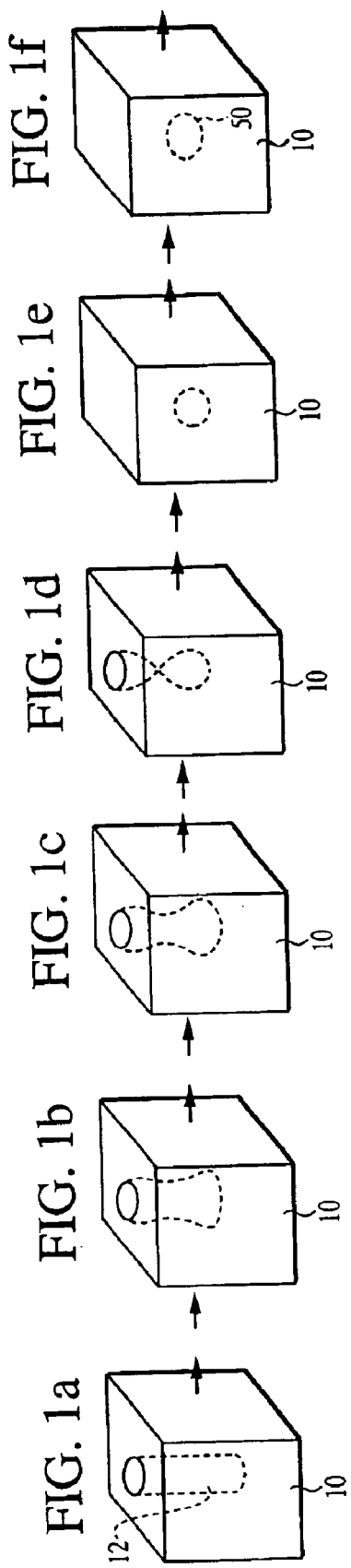

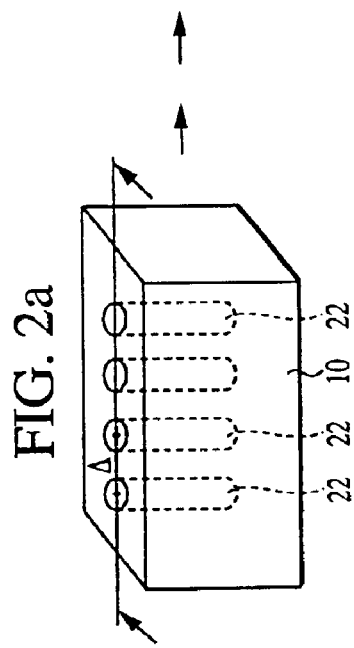

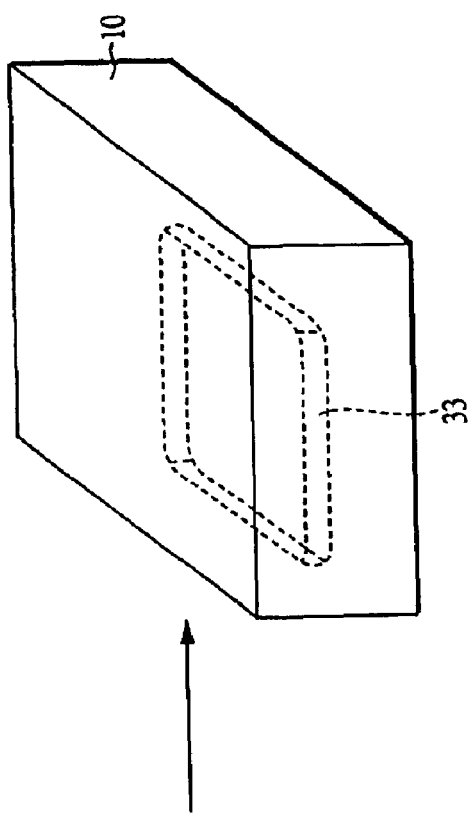
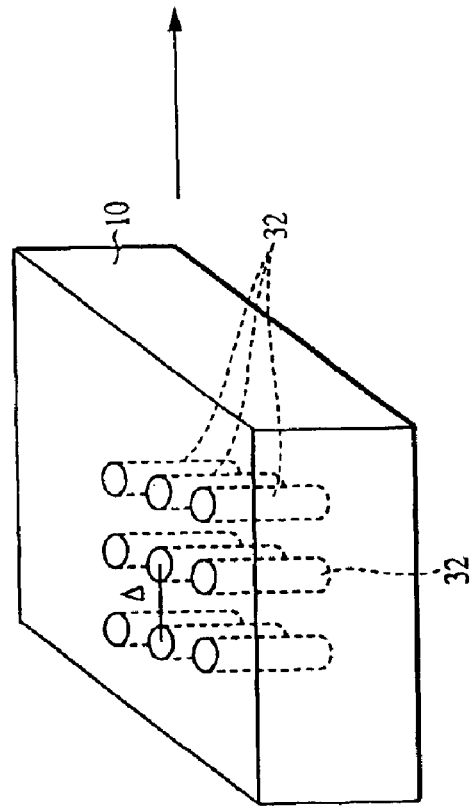

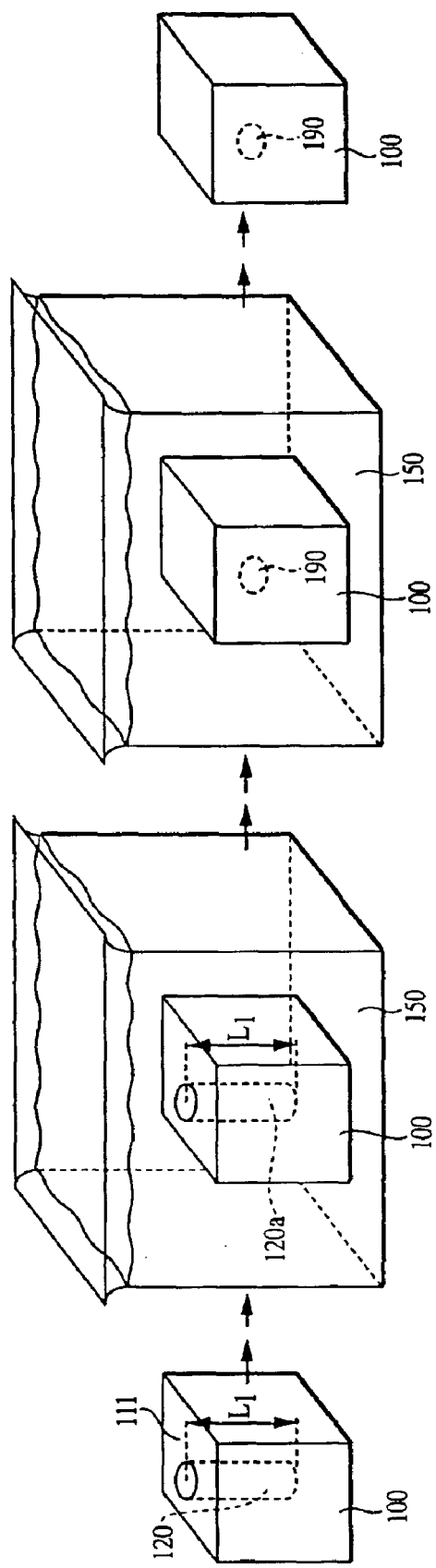

SPATIAL REGIONS OF A SECOND MATERIAL IN A FIRST MATERIAL

CROSS REFERENCE TO RELATED APPLICATIONS

The present application is a divisional application of U.S. patent application Ser. No. 10/118,350, filed on Apr. 9, 2002 the disclosure of which is incorporated by reference herein.

FIELD OF THE INVENTION

The present invention relates to solid state materials and, in particular, to a novel method of forming spatial regions having various geometries in such solid state materials.

BACKGROUND OF THE INVENTION

Crystalline solid state materials, such as single-crystal semiconductors, are the basis of the current microelectronics industry. Each single crystalline solid is a periodic structure in space, with a basic repeating unit called the unit cell. Crystalline solids are characterized by a variety of properties, for example, electrical properties such as electrical conductivity or charge mobility, optical properties such as refractive index or speed of photons, thermal properties such as thermal conductivity or thermal expansion, mechanical properties such as stress or strain curves, and chemical properties such as resistance to corrosion or reaction consistency, among others.

Over the past years, theoretical and experimental interests have focussed on controlling various properties of the solid state materials, for example, their optical and/or physical properties. As such, numerous photonic lattice experiments have been carried out to realize photonic bandgap effects at optical wavelength in periodic crystalline solids as a way of obtaining novel photonic properties in such solids. In one photonic lattice experiment, for example, Yablonovitch et al. (E. Yablonovitch. Phys. Rev. Lett., 58, 2059 (1987)) have suggested that the electromagnetic radiation propagating in periodic dielectric structures is similar to the electron waves propagating in a crystal. Yablonovitch et al. realized that setting up a periodic index of refraction pattern in a material can produce a band structure for electromagnetic waves where certain wavelengths can or cannot propagate, producing therefore the electromagnetic wave equivalent of a metal, semiconductor or insulator. If the wavelength is in the order of the dimensions of the crystal lattice, a photonic bandgap (a frequency range where photons are not allowed to propagate) can open up in two or three dimensions and lead to interesting phenomena, such as inhibition of spontaneous emission from an atom that radiates inside the photonic gap or frequency selective transmission and reflection. This way, for example, if a photonic crystal can be constructed to posses a full photonic bandgap, then a photonic insulator is created by artificially controlling the optical properties of the solid.

Other experiments have been carried out to achieve composite crystalline materials with novel physical and chemical properties. For example, the morphology and the local chemistry order of crystalline solid materials, and thus the physical properties of such crystalline materials, have been successfully influenced by creating the so-called "disordered materials." Disordered materials are defined as compositionally modulated materials characterized by the lack of regular and long-range periodicity, which is typical of crystalline solids. In the disordered materials, atoms or groups of atoms are disbursed through the material so that the constrains of periodicity which characterizes single crystalline materials are removed. As a result, it is now possible to place atoms in three dimensional configurations which were previously prohibited by the lattice constants of the crystalline materials. Accordingly, a whole new spectrum of semiconductor materials having novel physical, chemical and electrical properties has been made available to the semiconductor industry.

One of the limitations inherent in the above-mentioned photonic lattice experiments is the requirement that the dimensions of the lattice must be in the same order of magnitude as the desired band gap wavelength, or in other words, the refractive index variations or discontinuities should have periodicities on the same scale as the wavelength. As the dimensions of the lattice must be in the same order of magnitude as the desired band gap wavelength, the scaling down to the interesting optical and infrared frequencies has posed problems due to the demanded regularity and uniformity of the photonic lattice. In addition, the fabrication of the "disordered materials" is technologically difficult, as it requires non-equilibrium manufacturing techniques to provide a local order and/or morphology different from that achieved with equilibrium techniques. Further, the crystalline cells of the "disordered materials" are relatively thick because of their low absorption and, consequently, they are fragile, expensive and bulky.

Accordingly, there is a need for an improved method of synthesizing new and broad classes of composite materials which have unique photonic, electronic, magnetic, acoustic or superconducting properties that are significantly different from the properties of the materials from which they are formed. There is also a need for fabricating various spatial patterns and/or geometries in solid state materials to improve the photonic, electronic, magnetic, acoustic or superconducting properties of such solid state materials. There is further a need for an improved method of fabricating three-dimensional photonic bandgap structures in a wide variety of solid materials, such as monocrystalline substrates, dielectrics, superconducting materials or magnetic materials, among others. There is also a need for a more advantageous method of generating a wide variety of space group symmetries, with different group symmetries for wavelength regions of interests, in such variety of solid materials.

SUMMARY OF THE INVENTION

The present invention provides a method of forming various spatial patterns and geometries in solid state materials, as well as method of forming periodic index of refraction patterns in the supperlattice of a solid material to achieve photonic bandgap effects at desired optical wavelengths.

According to an exemplary embodiment of the invention, at least one spatial region of a second material is formed by surface transformation in a first solid material, for example in a monocrystalline silicon substrate or an insulator, to control the optical and electromagnetic properties of such first solid material. The spatial regions of the second material include at least one region which is formed in the first solid material by drilling holes to a predefined depth and at a predefined lattice position. The first solid material is then immersed in a melt of the second material and held at a temperature below the melting point of the first solid material. The temperature of the melt of the second solid material is subsequently increased to a temperature close to the melting point of the first solid material to spontaneously form the spatial region filled with the second material and embedded in the first solid material at the desired location. The spatial region filled with the second material which is embedded in the first solid material may have various geometries and sizes.

According to another exemplary embodiment of the invention, at least one spatial region of a second material is formed by surface transformation in a first solid material, for example in a monocrystalline silicon substrate or an insulator, to control the optical and electromagnetic properties of such first solid material. The spatial regions of the second material include at least one region which is formed in the first solid material by drilling holes to a predefined depth and at a predefined lattice position. The holes in the first solid material are subsequently filled with a second material by employing a deposition method, for example, chemical vapor deposition. The temperature of the first and second materials is subsequently increased to a temperature close to the melting point of the first solid material to spontaneously form the spatial region filled with the second material and embedded in the first solid material at the desired location. The spatial region filled with the second material which is embedded in the first solid material may have various geometries and sizes.

According to yet another embodiment of the invention, a plurality of space group symmetries of a second material are formed by surface transformation in a first solid material, for example in a monocrystalline silicon substrate or an insulator, to control the optical and electromagnetic properties of such first solid material. The space group symmetries of the second material includes a plurality of spatial regions filled with the second material, which are formed in the first solid material by drilling holes to a predefined depth and at a predefined lattice position. The first solid material is then immersed in a melt of the second solid material and held at a temperature below the melting point of the first solid material. The temperature of the melt of the second material is subsequently increased to a temperature close to the melting point of the first solid material to spontaneously form the space group symmetries filled with the second material and embedded in the first solid material at the desired location. Alternatively, a deposition method, for example, chemical vapor deposition, may be employed to fill in the holes. The space group symmetries filled with the second material which are embedded in the first solid material may have various geometries and sizes, and may be formed at different periodicities and in a variety of space group symmetries, so that photonic bandgap structures can be produced for wavelength regions of interest.

These and other features and advantages of the invention will be more clearly apparent from the following detailed description which is provided in connection with accompanying drawings and which illustrates exemplary embodiments of the invention.

BRIEF DESCRIPTION OF THE DRAWINGS

FIG. 1 illustrates a portion of a silicon substrate undergoing a sequence of steps for empty-spaced sphere formation.

FIG. 2 illustrates a portion of a silicon substrate undergoing a sequence of steps for empty-spaced pipe formation.

FIG. 3 illustrates a portion of a silicon substrate undergoing a sequence of steps for empty-spaced plate formation.

FIG. 4 illustrates three-dimensional views of a spherical region of a second material formed within a first material and according to a first embodiment of the present invention.

DETAILED DESCRIPTION OF THE EMBODIMENTS

Figure 5A:
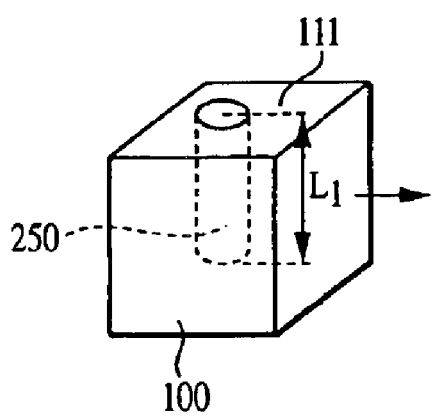
FIG. 5 illustrates three-dimensional views of a spherical region of a second material formed within a first material and according to a second embodiment of the present invention.

In the following detailed description, reference is made to various exemplary embodiments for carrying out the invention. These embodiments are described with sufficient detail to enable those skilled in the art to practice the invention, and it is to be understood that other embodiments may be employed, and that structural, electrical and process changes may be made, and equivalents substituted, without departing from the invention. Accordingly, the following detailed description is exemplary and the scope of the present invention is not limited by the detailed description but is defined solely by the appended claims.

In the exemplary embodiments described in detail below, reference will be made to a first solid material which is employed to form various spatial patterns and regions embedded in such first solid material for interacting with optical wavelengths. These various spatial regions and/or patterns are formed by an analogous method to that employed in the formation of empty-spaced void patterns in a silicon substrate. Accordingly, reference is made first to FIGS. 1–3 which illustrate the formation of empty-spaced void patterns 50, 23, 33 in a silicon substrate 10 of <100> crystal orientation. Techniques for the formation of empty-spaced (void) patterns of different geometries in silicon are described by Sato et al., in *Substrate Engineering for the Formation of Empty Space in Silicon (ESS) Induced by Silicon Surface Migration,* 1999 IEDM Digest, Paper 20.6.1, the disclosure of which is incorporated by reference herein.

Empty spaces which are formed in silicon substrates and have various shapes, such as plates, spheres or pipes, may be formed as a result of the self-organizing migration properties on the silicon surface. As such, when deeply-etched silicon substrates are annealed in an ambient atmosphere, such as a hydrogen ambient, for example, the silicon atoms on the surface migrate so that their surface energy is minimized. Based on these findings, Sato et al. have demonstrated that the geometry of empty spaces, such as sphere, plate and pipe, formed under the surface of a silicon substrate depends on the size, number and spacing of a plurality of cylindrical holes that are initially formed at temperatures lower than the melting temperature of silicon.

For example, FIGS. 1(a)–(f) illustrate how a single sphere-shaped empty space 50 is formed from a single cylindrical hole 12 formed within the silicon substrate 10. Subsequent to the formation of the cylindrical hole 12, the silicon substrate 10 is annealed at a temperature lower than the melting point of monocrystalline silicon (1400° C.), for example, at a temperature of about 1100° C. Sato et al. have demonstrated that, within about 60 seconds and under a reducing ambient of 10 Torr of hydrogen, the shape and surface morphology of the cylindrical hole 12 changes drastically to that of the sphere-shaped empty space 50 (FIG. 1(f)). Because of the significant surface and/or volume diffusion which occurs at high annealing temperatures, the cylindrical hole 12 is unstable beyond a critical length Lc and transforms, therefore, to a lower energy state consisting of one or more empty spheres formed along the original cylinder axis.

As analyzed by Nichols et al., in *Surface-(Interface-) and Volume-Diffusion Contributions to Morphological Changes Driven by Capillarity*, Trans. AIME 233 at 1840 (October 1965), the disclosure of which is incorporated by reference herein, the number N of empty spheres that form from a cylindrical hole depends both on the length L of the cylindrical hole and on the cylinder radius Rc. Accordingly, the number N of empty spheres formed from a cylindrical hole made in a silicon substrate can be estimated according to the following equation:

$$8.89\, Rc\, N \leq L < 8.89\, Rc\, (N+1) \quad (1)$$

wherein:

N=number of empty spheres;

Rc=radius of cylindrical hole; and

L=length of cylindrical hole.

Thus, equation (1) predicts that, if L<8.89 Rc, the number of empty spheres will be N=0, which means that no empty spheres will form from a cylindrical hole.

When one or more empty spheres form with a radius Rs, then according to Nichols et al., the value of Rs is given by the following equation:

$$Rs = 1.88\, Rc \quad (2)$$

wherein:

Rs=sphere radius; and

Rc=radius of cylindrical hole.

When two or more empty spheres form from a cylinder hole with a cylinder radius Rc, then the distance "1" between the centers of two adjacent empty-spaced spheres is calculated from the following formula:

$$l = 8.89\, Rc \quad (3)$$

wherein:

l=center-to-center distance between two adjacent spheres; and

Rc=radius of cylindrical hole.

Reference is now made to FIGS. 2(a)–(c), which exemplify the formation of a single pipe-shaped empty space 23 from a linear array of cylindrical holes 22. Similarly, FIGS. 3(a)–(b) illustrate the formation of a single plate-shaped empty space 33 from a two-dimensional array of cylindrical holes 32 formed within a silicon substrate such as the silicon substrate 10. The values of the pipe radius Rp (of the pipe-shaped empty space 23) and that of the plate thickness Tp (of the plate-shaped empty space 33) may be calculated in a manner similar to that described above with reference to the formation of the empty sphere 50 and the calculation of sphere radius Rs in equation (1). The distance A between the centers of any two adjacent cylindrical holes 22, 32, in a linear array, may be calculated from the following formula:

$$2\, Rc < \Delta < 3.76\, Rc \quad (4)$$

wherein:

Rc=radius of cylindrical hole; and

Δ=center-to-center distance between two adjacent cylindrical holes in a linear array.

Equation (4) ensures that adjacent cylindrical holes 22, 32 do not touch each other allowing, therefore, the formation of a plurality of adjacent spheres that combine to form the resulting pipe-shaped empty space 23 and plate-shaped empty space 33.

The values of the pipe radius Rp and of the plate thickness Tp are given by the following two expressions:

$$Rp = (8.86\, Rc^3/\Delta)^{1/2} \quad (5)$$

$$Tp = 27.83\, Rc^3/\Delta^2 \quad (6)$$

wherein:

Rp=pipe radius;

Tp=plate thickness; and

Δ=center-to-center distance between two adjacent cylindrical holes in a linear array.

To illustrate the formation of an exemplary embodiment of a spatial region of a second material formed within a first solid material, the present invention will be explained with reference to the formation of a sphere of a second material formed within a first solid material by the technique similar to that described above with reference to FIG. 1(a)–(f). However, it must be understood that the invention may be used to form any spatial regions, patterns and geometries, such as the pipes and plates described above with reference to FIGS. 2(a)14 (c) and FIGS. 3(a)–(b), and thus the invention is not limited to the formation of sphere-shaped regions.

Figure 5B:
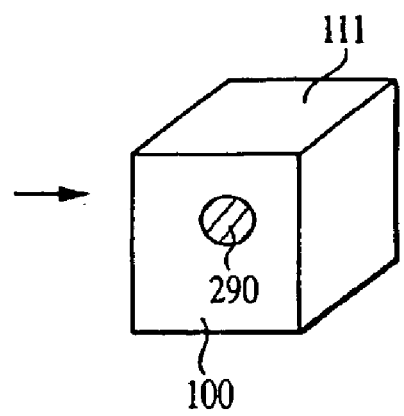

Referring now to FIG. 4(a), a linear cylindrical hole 120 is formed into a first solid material 100 as a first step in the formation of a sphere 190 (FIG. 4(d)) and a sphere 290 (FIG. 5(b)) of a second material embedded in the first solid material 100. The linear cylindrical hole 120 (FIG. 4(a)) is drilled into the first solid material 100 from an upper surface 111 of the first solid material 100 to a depth $L_1$, which also represents the length of the cylindrical hole 120.

Applying equation (1) to the parameters of the linear cylindrical hole 120, the number of empty spheres N to be obtained from the single cylindrical hole 120 depends upon the cylinder radius $Rc_1$ and the length $L_1$ of the cylindrical hole 120. Accordingly, a valid solution for the equation (1) for the relationship between the number of spheres N and the length $L_1$ of the cylindrical hole 120 is the following:

$$L_1 = 8.89\, Rc_1\, N \quad (7)$$

wherein:

N=number of empty spheres formed from cylindrical hole 120;

$Rc_1$=radius of cylindrical hole 120; and $L_1$=length of cylindrical hole 120.

Accordingly, if one sphere is desired from the cylindrical hole 120, then the radius Rc of the cylindrical hole 120 and the depth $L_1$ satisfies equation (7) above for N=1.

The first solid material 100 may be any solid state material, structure or combination of material/structure for which its optical, electronic, and acoustic properties, among others, can be modified by the formation of spatial patterns, or by the rearrangement of photonic energy bands, in such material, structure, or combination thereof. Thus, the term "material" is to be understood as including, for example, linear and non-linear optical materials, metals, semiconductors and insulators, acoustic materials, magnetic materials, ferroelectric materials, piezoelectric materials, and superconducting materials, among others. In addition, the term "material" is to be understood as including substrates formed of silicon, silicon-on-insulator, doped and undoped semiconductors, epitaxial layers of silicon supported by a base semiconductor foundation, and other semiconductor structures.

Referring now to FIG. 4(b), subsequent to the formation of cylindrical hole 120 in the first solid material 100, the first solid material 100 is immersed into a liquid-phase melt 150 (FIG. 4(b)) of a second material. The second material of the liquid-phase melt 150 is selected so that its melting point temperature $T_M(150)$ is below the melting point temperature $T_M(100)$ of the first solid material 100. This way, during the immersion step, the temperature of the liquid-phase melt 150 is maintained at an initial temperature $T_1$, which is above the melting temperature $T_M(150)$ of the liquid-phase melt 150, but well below the melting temperature $T_M(100)$ of the first solid material 100. As a consequence, parts of the liquid-phase melt 150 fill the cylindrical hole 120 to form a cylindrical hole 120a (FIG. 4(b)) filled with the second material and formed within the first solid material 100.

Subsequent to the formation of the cylindrical hole 120a (FIG. 4(b)) filled with the second material, the temperature of the liquid-phase melt 150 is increased to allow surface and volume diffusion to drive the transformation of the cylindrical hole 120a filled with the second material into a sphere-shaped region 190 (FIG. 4(c)), which is filled with the second material of the liquid-phase melt 150 and embedded in the first solid material 100. During this processing step, the temperature of the liquid-phase melt 150 is increased from the initial temperature $T_1$ to a second, final temperature $T_F$ which is below the melting temperature $T_M(100)$ of the first solid material 100. Table 1 below illustrates the melting and boiling temperatures for few representative and non-limiting examples of materials which may be used in the invention. These material are aluminum (Al), germanium (Ge), silicon (Si) and silicon dioxide ($SiO_2$).

TABLE 1

|  | $T_M$ | $T_B$ |
|---|---|---|
| Al | 660° C. | 2647° C. |
| Ge | 937° C. | 2830° C. |
| Si | 1410° C. | 2355° C. |
| $SiO_2$ | 1600° C. | 2230° C. |

It is evident from the data of Table 1 that, for the above four mentioned materials, it is possible to form (1) an aluminum sphere-shaped region 190 in germanium, an aluminum sphere-shaped region 190 in silicon, or an aluminum sphere-shaped region 190 in silicon dioxide; (2) a germanium sphere-shaped region 190 in silicon or a germanium sphere-shaped region 190 in silicon dioxide; and (3) a silicon sphere-shaped region 190 in silicon dioxide.

Referring to FIG. 4(d), subsequent to the formation of the sphere-shaped region 190 (FIG. 4(c)) filled with the second material of the liquid-phase melt 150 and embedded in the first solid material 100, the first solid material 100 is removed from the liquid-phase melt 150. The temperature of the first solid material 100 is slowly decreased to below the melting temperature $T_M(150)$ of the liquid-phase melt 150 so that the sphere-shaped region 190 is completely formed and embedded within the first solid material 100. This way, for example, if the embedded second material and the first solid material 100 have different indices of refraction, then a photonic crystal is formed where the transmission and the reflection of electromagnetic waves is significantly different from those of each individual material (that is, the first solid material and the second material). In addition, for certain choices of index difference, crystal symmetry and periodicity, a complete photonic bandgap can result where the wavelength range within the complete gap light (electromagnetic waves) will not be propagated due to destructive interference, but will rather be totally reflected for all directions of propagation.

FIG. 5 illustrates another embodiment of the present invention, according to which a deposition method is employed to fill the linear cylindrical hole 120 (FIG. 4(a)) as an alternative method to the liquid-phase melt immersion method described above with reference to FIGS. 4(b)–4(d). Referring now to FIG. 4(a) and FIG. 5(a), subsequent to the formation of the cylindrical hole 120 (FIG. 4(a)) in the first solid material 100, a deposition method is employed to fill in the cylindrical hole 120 with a second material 250 (FIG. 5(a)). The second material 250 is selected so that its melting temperature $T_M(250)$ is below the melting temperature $T_M(100)$ of the first solid material 100.

In an exemplary embodiment of the invention, deposition methods such as, for example, a conventional chemical vapor deposition (CVD), plasma enhanced CVD (PECVD) or physical vapor deposition (PVD), among others, may be used to substantially fill in the cylindrical hole 120 of FIG. 4(a) with the second material 250 (FIG. 5(a)). Subsequent to the deposition of the second material 250, the first material 100 as well as the second material 250 are heated up to a temperature T which is near or below the melting temperature $T_M(100)$ of the first material 100, and at or above the melting temperature $T_M(250)$ of the second material 250. The temperature increase in the first material 100 and in the second material 250 allow significant surface and volume diffusion in the second material 250 as well as in the first material 100 to drive the transformation of the cylindrical hole 120 filled with the melt of the second material 250 into a sphere-shaped region 290 (FIG. 5(b)), which is filled with the second material 250 and formed within the first material 100. Finally, the temperature of the first solid material 100 is slowly decreased to a final temperature $T_F$ which is below the melting temperature $T_M(250)$ of the second solid material 250 so that the sphere shaped region 290 of the second material 250 solidifies.

Although the exemplary embodiments described above refer to the formation of a spatial region having a sphere-shaped configuration filled with a second material and embedded within a first solid material, it must be understood that other geometries and spatial patterns or regions, for example pipe-shaped or plate-shaped configurations, may be formed also, as desired and as illustrated in FIGS. 2–3. In addition, the present invention is not limited to the formation of only one spatial region of a second material embedded within a first solid material, and the invention contemplates the formation of a plurality of such spatial regions within a first solid material. Further, the plurality of spatial regions may have any of the sphere-, pipe- or plate-shaped configurations, or any combination of such configurations. The plurality of regions may all be formed simultaneously or may be formed subsequent to each other. In one embodiment, all regions may contain a second material embedded within a first material. In another embodiment, the regions may contain a plurality of different materials (for example, a second, third, fourth, etc, material) each embedded within the first solid material. For example, and in accordance with Table 1, if two regions are formed within a first material such as silicon dioxide, one of the two regions may be of aluminum embedded within silicon dioxide, whereas the other of the two spatial regions may be formed of germanium embedded within silicon dioxide.

Figure 6:
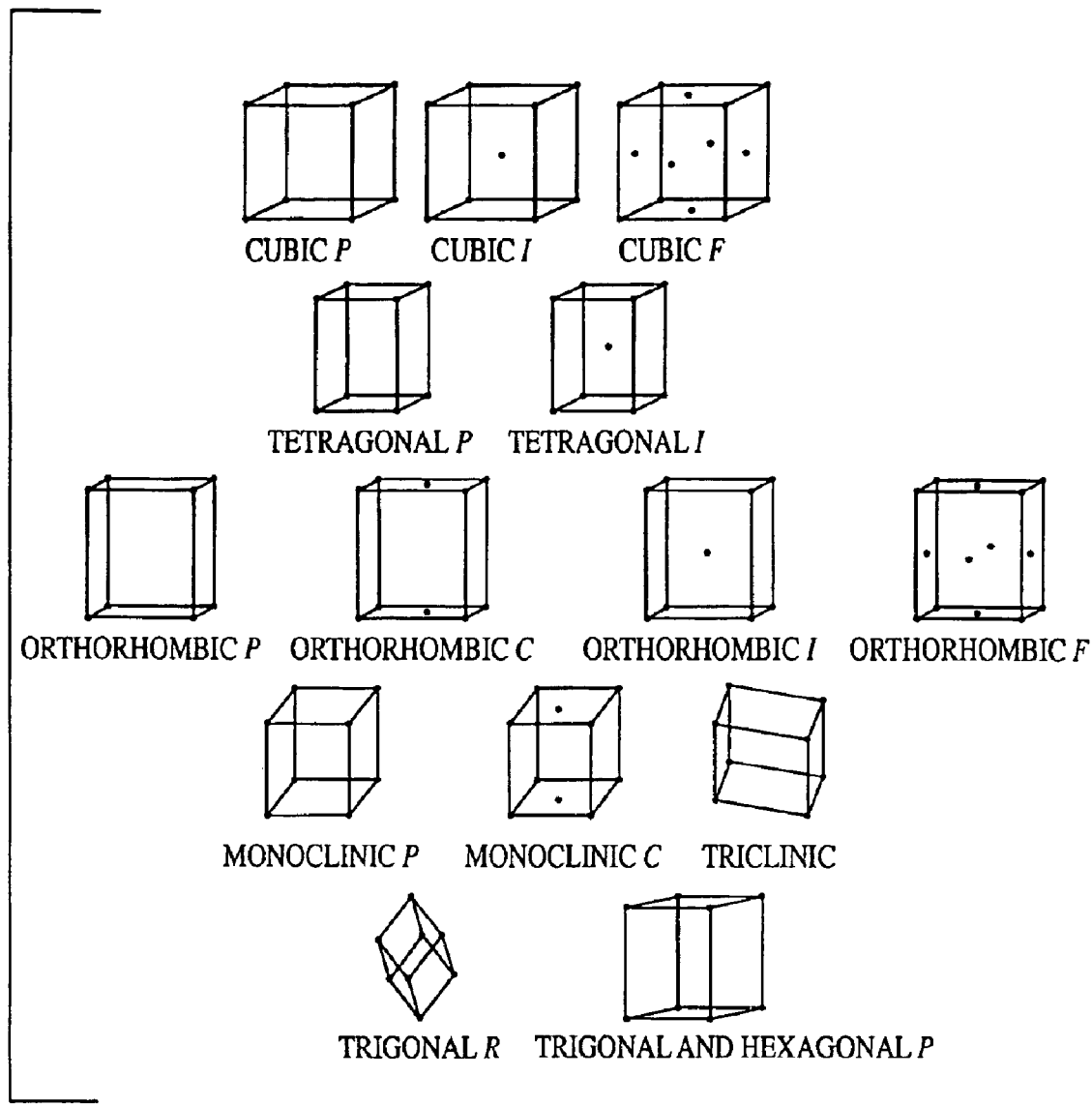
FIG. 6 illustrates fourteen representative unit cells of space lattices which can be constructed according to the methods of the present invention.

According to another embodiment of the invention, a plurality of space group symmetries of a second material are formed in the superlattice of a first solid material, to achieve photonic band effects at desired optical wavelengths. FIG. 6 illustrates the unit cells of fourteen primitive space lattices. For the purposes of the present invention, the term "unit cell" is to be understood as including any of the known space lattice unit cells.

Figure 7:
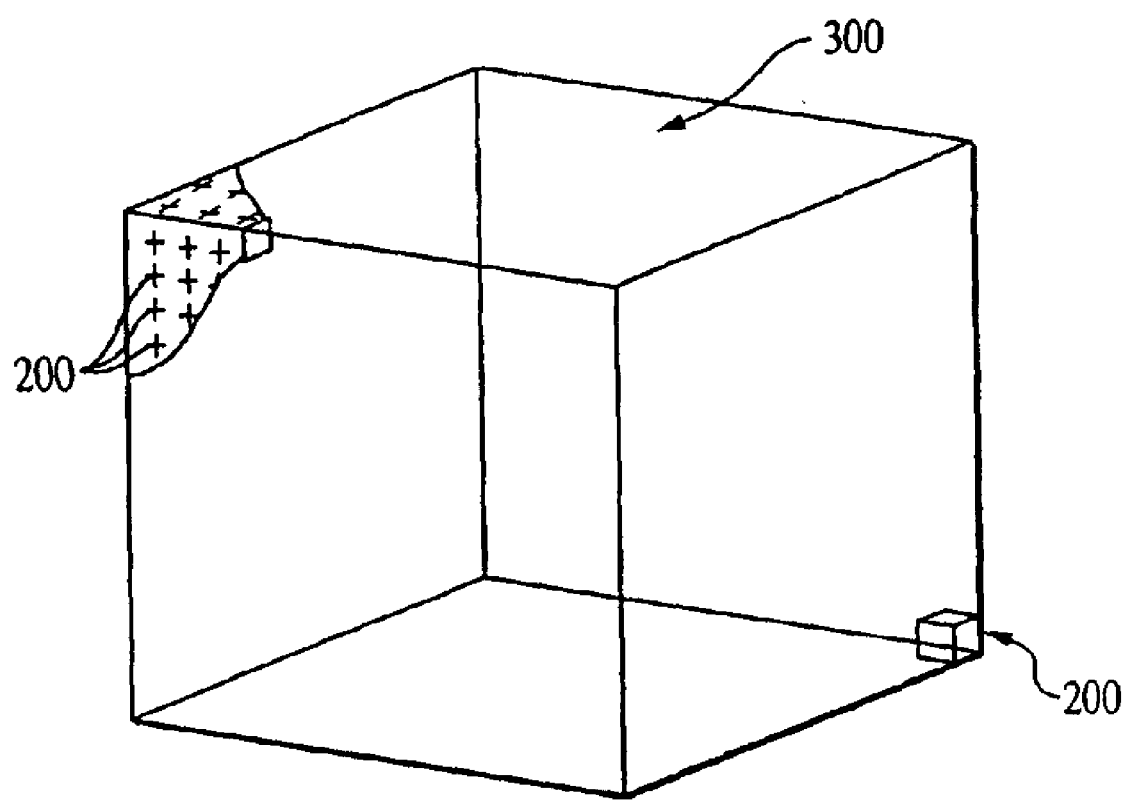
FIG. 7 is an isomeric view of a photonic crystal comprising an array of unit cells formed of a second material in a first material and according to methods of the present invention.

To illustrate the formation of an exemplary embodiment of such a photonic band structure material of a second material formed within a first solid material, the present invention will be explained with reference to the formation of a photonic crystal 300 (FIG. 7) formed of unit cells 200 (FIG. 7) having spheres of a second material embedded within a first solid material and formed by the technique described above with reference to FIGS. 4(a)–(d). For simplicity, the present invention will be explained with reference to the formation of the cubic P unit cell of FIG. 6 with lattice constant "$a_0$" which is again depicted in FIG. 8. In the present application, we assume that spheres of a second material are formed in a wafer of the first material, such that the x, y axes are in the plane of the wafer and the z axis is normal to the plane. To form spheres of the second material at each of the unit cell lattice positions in FIG. 8, it is necessary to drill a defined set of cylindrical holes into the wafer of the first material.

For simplicity, the formation of one unit cell in (x, y) direction and of n unit cells in the z-direction will be now discussed. To form additional unit cells in the (x,y) plane, repeated translation of the hole pattern in the x and y direction is all that is required. From equations (2) and (3) above, it is known that to create spheres with periodicity $a_0$ in the z-direction requires that the radius Rc of the cylindrical holes must be $Rc = a_0/8.89 \cong 0.11a_0$ and after surface transformation the radius Rs of each formed sphere of the second material will be $Rs = (1.88/8.99)a_0 \cong 0.212a_0$. Accordingly, the depth Ln of the initial cylindrical holes that will form by surface transformation for n unit cells in the z-direction is $$Ln = (n+1)a_0 = (n+1)(8.89)Rc \quad (8)$$

To form a single unit cell (i.e. two spheres) in the z-direction, as it will be described below, the required hole depth is $L_{1=2}$ (8.89) Rc.

Figure 8:
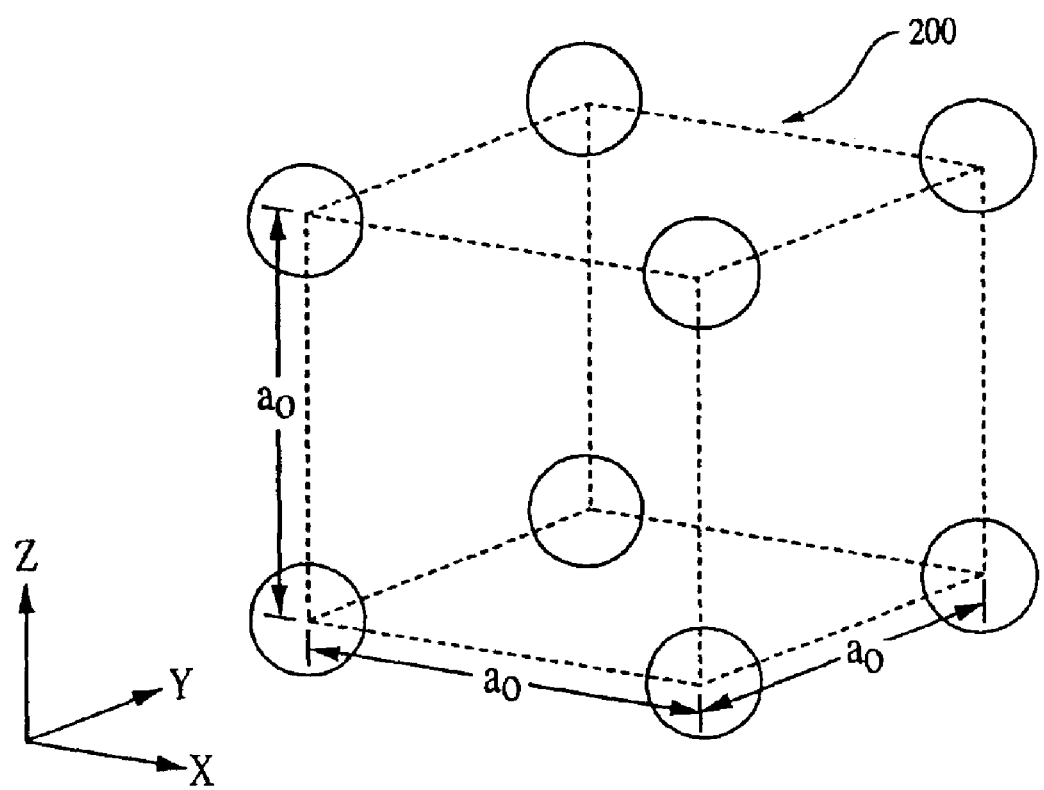
FIG. 8 illustrates the cubic P unit cell of FIG. 6.
Figure 9A:
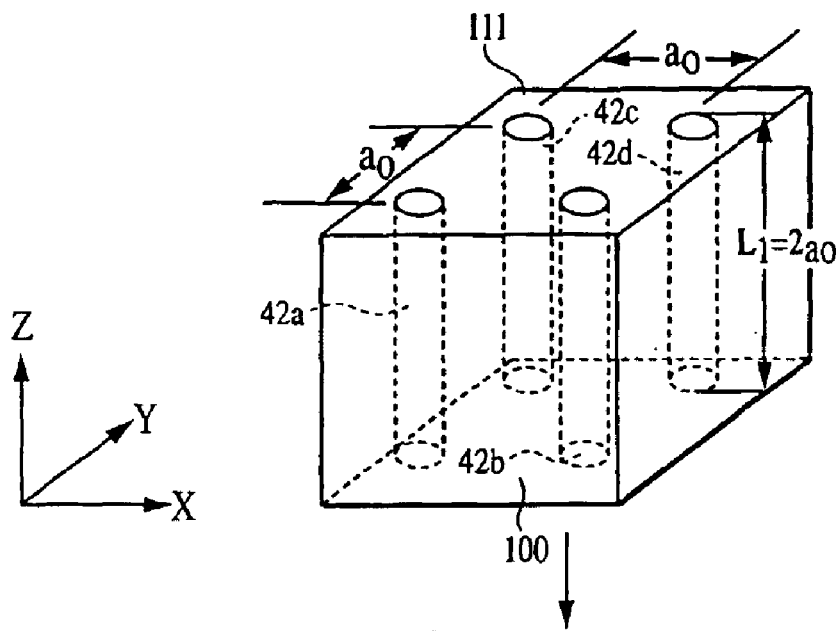
FIG. 9 illustrates various processing steps for forming a cubic lattice of spherical regions of a second material in a first material according to methods of the present invention.

Referring now to FIG. 9, during the first step in the formation of the cubic unit 200 (FIG. 8), four linear cylindrical holes 42a, 42b, 42c and 42d (FIG. 9(a)) of radius $Rc = 0.11a_0$ are drilled into the first solid material 100 from an upper surface 111 of the first solid material 100 to a depth $L_{1=}2a_0$. The four cylindrical holes 42a, 42b, 42c, 42d are spaced apart along the x and y axes at a distance "$a_0$" which represents the lattice constant of the cubic unit cell 200 (FIG. 8).

Figure 9B:
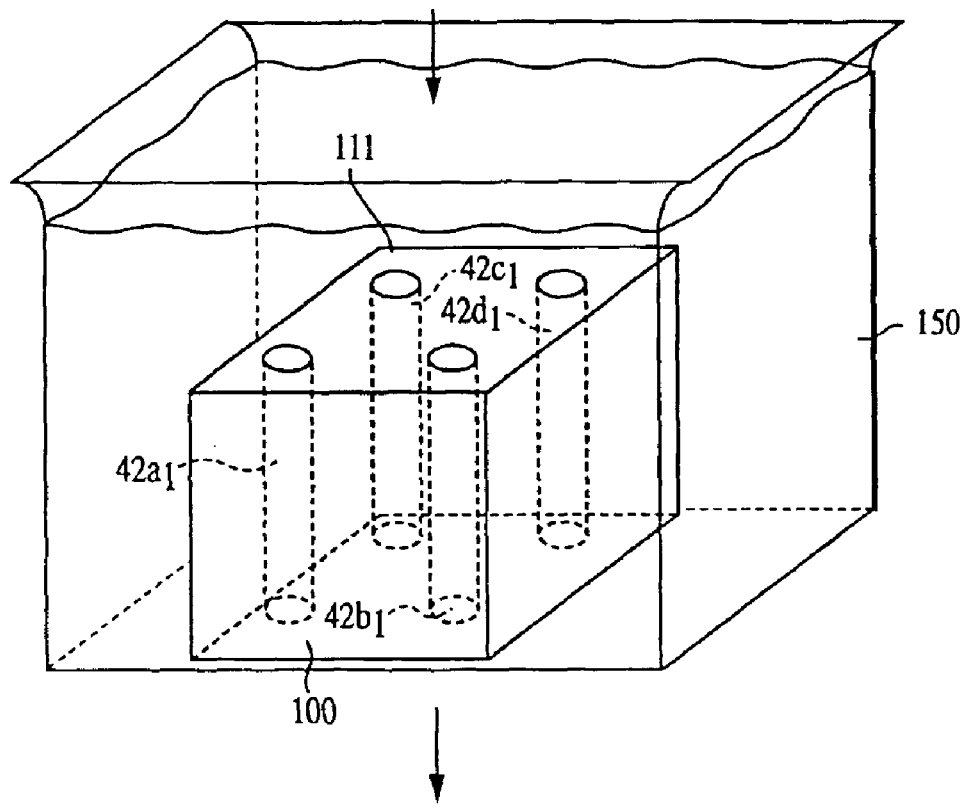

Subsequent to the formation of cylindrical holes 42a, 42b, 42c, 42d in the first solid material 100, the first solid material 100 is immersed into a liquid-phase melt 150 (FIG. 9(b)) of a second material. The second material of the liquid-phase melt 150 is selected so that its melting point temperature $T_M(150)$ is below the melting point temperature $T_M(100)$ of the first solid material 100. During the immersion step, the temperature of the liquid-phase melt 150 is maintained at an initial temperature $T_1$, which is above the melting temperature $T_M(150)$ of the melt 150 but well below the melting temperature $T_M(100)$ of the first solid material 100. This way, melt of the second material fills the cylindrical holes 42a, 42b, 42c, 42d to form cylindrical holes 42a1, 42b1, 42c1, 42d1 (FIG. 9(b)) of the melt of the second material within the first solid material 100.

After the formation of the cylindrical holes 42a1, 42b1, 42c1, 42d1 (FIG. 9(b)), the temperature of the liquid-phase melt 150 is increased from the initial temperature $T_1$ to a second temperature $T_2$ which is near to, but below, the melting temperature $T_M(100)$ of the first solid material 100. At this second temperature $T_2$ surface and volume diffusion drives the transformation of the cylinders 42a1, 42b1, 42c1, 42d1 filled with the melt of the second material into sphere-shaped regions 50a, 50b, 50c, 50d, 51a, 51b, 51c and 51d (FIG. 9(c)) containing the melt of the second material. These sphere-shaped regions form the desired cubic unit cell 200 depicted in FIG. 8.

Figure 9C:
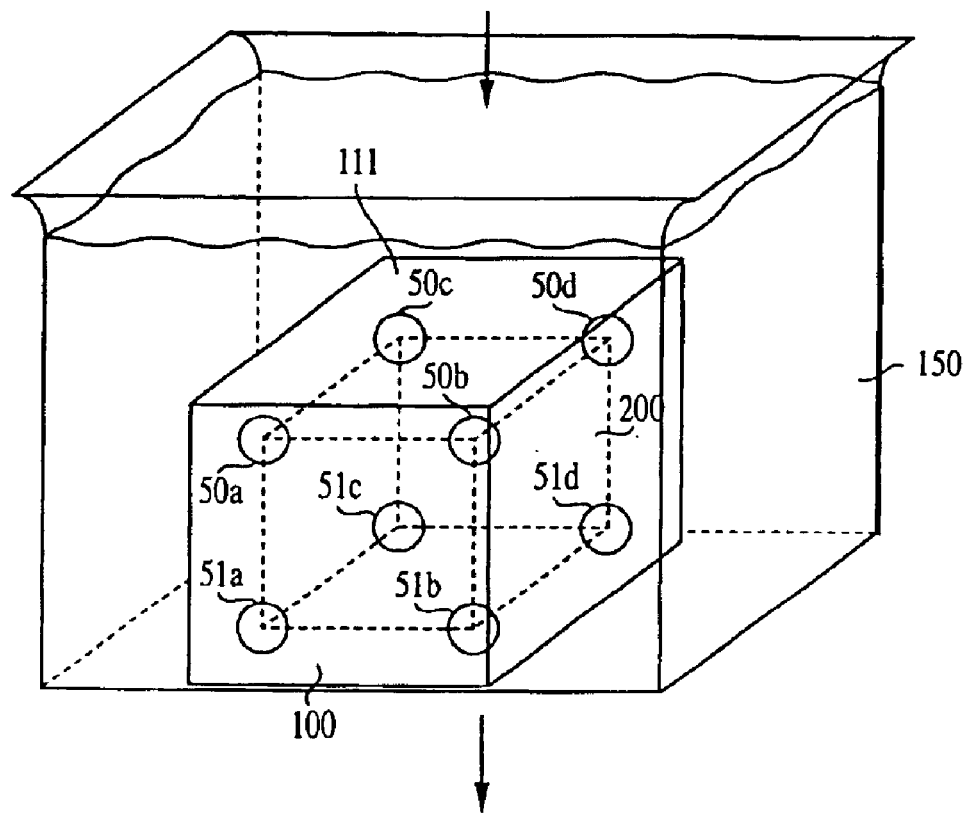

Finally, referring to FIG. 9(d), the first solid material 100 is removed from the liquid-phase melt 150 (FIG. 9(c)) and allowed to cool below the melting temperature $T_M(150)$ of the liquid-phase melt 150, thus allowing the sphere-shaped regions 50a, 50b, 50c, 50d, 51a, 51b, 51c and 51d of the second material to solidify within the first solid state material 100.

Figure 9D:
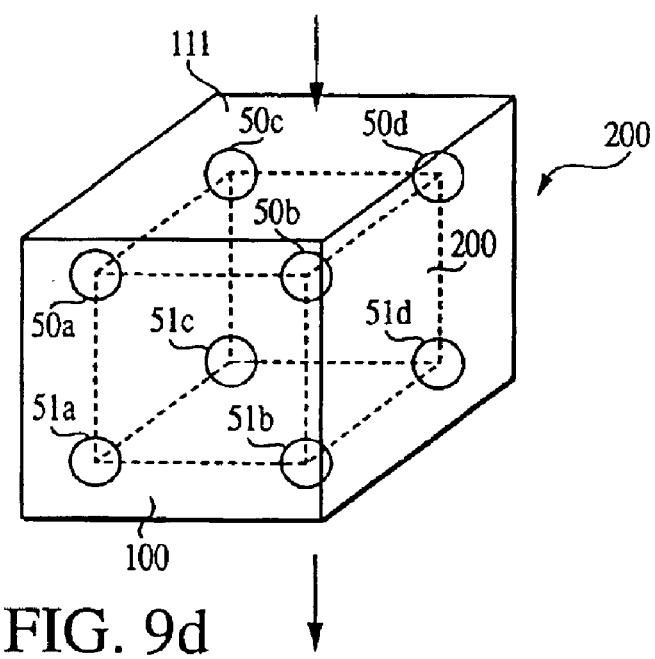

By arranging the spatial regions (for example, the spheres 50a, 50b, etc) in a particular order and in a predetermined periodic form (for example, the cubic unit 200 of FIG. 9(d)) in a substrate photonic material (for example, the first solid material 100), the spatial regions act as diffraction centers for energy particles, such as electromagnetic waves, photons, X rays, gamma rays, electrons, light particles, magnetic waves or elastic waves, among others. The periodicity of the spatial regions formed according to the present invention will dictate the wavelength in which the particular photonic material scatters. Accordingly, the distance of separation between adjacent spatial regions, which is also the lattice constant "$a_0$," may be chosen to have a particular value that would allow diffraction to occur at a particular wavelength. For example, if the value of "$a_0$" is very big, in fractions of centimeters, then the microwave spectrum occurs. Conversely, if the value of "$a_0$" is very small, in fractions of wavelength of light, then the optical range occurs. This way, by adjusting the value of "$a_0$" for a given solid material, one skilled in the art can predict when an allowed energy band or a forbidden energy band (phototnic bandgap) may occur in such solid material.

Thus, the present invention provides a method for forming diffraction spatial patterns and regions of a second material, arranged in periodic form in the superlattices of a first solid material, that will modify the transmission and reflection properties of the first solid material, and consequently, the energy bands for light in such first solid material.

Although the embodiment illustrated above with reference to FIG. 9 has been described with reference to the formation of regions of a second material embedded within a first material by the liquid-phase melt immersion method, the above-illustrated embodiment is not limited to the immersion method. Accordingly, the present invention contemplates the formation of the unit cell 200 of FIG. 9(d), by methods other than the liquid-phase melt immersion, for example, by the deposition method described in detail above with reference to the formation of the spatial region 290 (FIG. 5(b)) filled with a second material and embedded within a first solid material.

Although the unit cell 200 of FIG. 9(d) contains only eight empty-spaced spheres per unit cell formed from four cylindrical holes, it must be understood that in fact any number of such cylindrical holes may be drilled so that any number of their corresponding spheres of second material may be formed in the superlattice of the first solid material 100, as desired. Accordingly, although the method of the present invention has been explained with reference to the formation of only one cubic unit 200 (FIG. 9(d)), it must be obvious to those skilled in the art that in fact any number of such cubic units of a second material forming the photonic bandgap lattice may be formed within the first solid material 100 by methods of the present invention.

Although the exemplary embodiments described above refer to the formation of a lattice of unit cells having a specific cubic configuration, it must be understood that other lattices of unit cells may be formed, depending on the characteristics of the particular lattice and photonic bandgap structure to be fabricated. As noted above, FIG. 6 illustrates a plurality of conventional representative unit cells forming various space lattices, as described by C. Kittel in *Introduction to Solid State Physics* (J. Whiley & Sons, 3d Ed (1966)), which may be formed as spatial patterns of a second material embedded in a first solid material in accordance with the invention.

Further, the invention is not limited to the formation of a unit cell having the diffraction centers formed of spheres of a second material embedded within a first solid material, but other regions or patterns, for example pipes, such as the empty-space pipe 23 (FIG. 2), and/or plates, such as the empty-space plate 33 (FIG. 3), may be employed in any number or orientation and any combination to form the unit cells of FIG. 6. In addition, although the invention has been described with reference to the formation of spheres of a second material embedded within a first solid material forming diffraction centers and having similar radii, the invention also contemplates the formation of spheres of two or more materials, having different radii. Finally, the spatial patterns and regions formed according to embodiments of the present invention act as diffraction centers not only for optical wavelengths, but for other energy particles, such as, for example, microwaves, photons, X rays, gamma rays, as well as for magnetic waves, elastic waves, electrons and/or ions, among others.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

I claim:

1. A solid material having spatial regions arranged therein in a predefined pattern, said spatial regions being surrounded by said solid material and providing said solid material with a predetermined energy particle diffraction pattern, said spatial regions comprising a material different from said solid material, said solid material having a melting temperature higher than the melting temperature of said different material.

2. The solid material of claim 1, wherein said spatial regions include a pipe-shaped pattern.

3. The solid material of claim 1, wherein said spatial regions include a plate-shaped pattern.

4. The solid material of claim 1, wherein said spatial regions include a sphere-shaped pattern.

5. The solid material of claim 1, wherein said spatial regions are arranged in at least one unit cell pattern.

6. The solid material of claim 1, wherein said solid material is a monocrystalline substrate.

7. The solid material of claim 1, wherein said solid material is a magnetic material.

8. The solid material of claim 1, wherein said solid material is selected from the group consisting of insulators, semiconductors and metals.

9. A solid material having regions arranged within said solid material in a periodic array, said regions being completely surrounded by said solid material and having different particle diffraction patterns than said solid material without regions, said regions comprising a material different from the material of said solid material, wherein said solid material includes silicon dioxide and said material of said regions is selected from the group consisting of aluminum, silicon and germanium.

10. The solid material of claim 9, wherein said regions include a pipe-shaped region.

11. The solid material of claim 9, wherein said regions include a plate-shaped region.

12. The solid material of claim 9, wherein said regions include a sphere-shaped region.

13. The solid material of claim 9, wherein said periodic array includes at least one unit cell.

14. The solid material of claim 13, wherein said unit cell is a body-centered cubic unit.

\* \* \* \* \*